US006201758B1

(12) United States Patent
Morishima et al.

(10) Patent No.: US 6,201,758 B1
(45) Date of Patent: Mar. 13, 2001

(54) SEMICONDUCTOR MEMORY DEVICE PERMITTING TIME REQUIRED FOR WRITING DATA TO BE REDUCED

(75) Inventors: Chikayoshi Morishima; Yasunobu Nakase; Tetsuya Watanabe; Niichi Itoh, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/499,044

(22) Filed: Feb. 7, 2000

(30) Foreign Application Priority Data

Aug. 6, 1999 (JP) .................................................. 11-223836

(51) Int. Cl.$^7$ ...................................................... G11C 8/00
(52) U.S. Cl. ................ 365/230.05; 365/203; 365/230.06
(58) Field of Search .......................... 365/230.05, 230.06, 365/189.04, 189.03, 203, 189.08

(56) References Cited

U.S. PATENT DOCUMENTS

| | | | |
|---|---|---|---|
| 4,866,677 | * 9/1989 | Sakurai | ................................. 365/222 |
| 5,912,850 | * 6/1999 | Wood et al. | ........................... 365/201 |
| 5,999,478 | * 12/1999 | proebsting | ......................... 365/230.05 |

FOREIGN PATENT DOCUMENTS 1-251384   10/1989   (JP) .

* cited by examiner

*Primary Examiner*—David Nelms
*Assistant Examiner*—Thong Le
(74) *Attorney, Agent, or Firm*—McDermott, Will & Emery

(57) ABSTRACT

A precharge circuit and a bit line load circuit are provided to a read bit line pair. The bit line load circuit continuously supplies a prescribed current to a read bit line. When data is written to one of memory cells selected in common by one read word line, the level of each read bit line will not be lowered to the level of the ground potential by the bit line load circuit if a read word line is activated, and therefore the loads of both discharge and charge operations by transistors in the memory cell are reduced.

9 Claims, 13 Drawing Sheets

SEMICONDUCTOR MEMORY DEVICE PERMITTING TIME REQUIRED FOR WRITING DATA TO BE REDUCED

BACKGROUND OF THE INVENTION

1. Field of the Invention

The present invention relates generally to semiconductor memory devices, and more particularly to a multi-port random access memory (hereinafter as "multi-port RAM").

2. Description of the Background Art

FIG. 11 is a schematic block diagram of the configuration of a conventional 2-port static random access memory 6000 (hereinafter as "2-port SRAM").

FIG. 11 shows the configuration of 2-port SRAM 6000 having memory cells corresponding to 4 bits in a matrix of two rows and two columns for ease of illustration.

Referring to FIG. 11, 2-port SRAM 6000 includes a memory cell array 10 having memory cells DM1 to DM4 for 4 bits arranged in a matrix of 2 rows and 2 columns, read word lines RWL0 to RWL1 provided corresponding to the rows of memory cells to select a row in memory cell array 10 at the time of reading data, write word lines WWL0 to WWL1 provided corresponding to the rows of memory cells to select a row in memory cell array 10 at the time of writing data, read bit lines RB0, /RB0 provided in common to memory cells DM1 and DM3 to read out data from these memory cells, read bit lines RB1, /RB1 provided in common to memory cells DM2 and DM4 to read out data from these memory cells, write bit lines WB0, /WB0 provided in common to memory cells DM1 and DM 3 to write data to these memory cells, write bit lines WB1, /WB1 provided in common to memory cells DM2 and DM4 to write data to these memory cells, and a precharge circuit 1 to charge read bit lines RB0, /RB0, RB1, and /RB1.

Two-port SRAM 6000 is externally provided with a read clock signal RCLK and a read address signal RA0, RA1 and read data RD is output in response to these signals. More specifically, a read address decode circuit 3 receives read clock signal RCLK and a read address signal RA0, RA1, selects read word line RWL0 or RWL1 and outputs a read column select signal RY0, RY1 to select a read bit line and a precharge signal /PCG to control precharge circuit 1. A reading circuit 5 amplifies the potential of a read bit line and outputs read data RD.

Meanwhile, 2-port SRAM 6000 is externally provided with a write clock signal WCLK and a write address signal WA0, WA1 and write data WD is stored in response to these signals. More specifically, a write address decode circuit 4 receives write clock signal WCLK and a write address signal WA0, WA1, selects word line WWL0 or WWL1 and outputs a write column select signal WY0, WY1 to select a write bit line. A writing circuit 6 writes write data WD to a selected memory cell through the write bit line.

FIG. 12 is a circuit diagram showing the configuration of memory cell DM1 shown in FIG. 11. Note that the other memory cells DM2 to DM4 basically have the same configuration as memory cell DM1 except that word lines or bit lines to be connected therewith are different.

Referring to FIG. 12, memory cell DM1 includes a latch circuit including a P-channel transistor P1 and an N-channel transistor N1 connected in series between a power supply potential Vcc and a ground potential GND and a P-channel transistor P2 and an N-channel transistor N2 connected in series between power supply potential Vcc and ground potential GND. The gates of transistors P1 and N1 are connected together to the connection node /SN (hereinafter as "storage node /SN") of transistors P2 and N2, while the gates of transistors P2 and N2 are connected together to the connection node SN (hereinafter as "storage node SN") of transistors P1 and N1. More specifically, P-channel transistors P1 and P2 operate as load transistors and N-channel transistors Ni and N2 operate as driver transistors.

An N-type read access transistor N3 is provided between read bit line RB0 and storage node SN, an N-type read access transistor N4 is provided between read bit line /RB0 and storage node /SN, and the gate potentials of transistors N3 and N4 are controlled by read word line RWL0.

N-channel transistors N5 and N6 are connected in series between storage node SN and ground potential GND, while N-channel transistors N7 and N8 are connected in series between storage node /SN and ground potential GND. The gate potentials of N-channel transistors N5 and N7 (hereinafter as "write access transistors") are controlled by write word line WWL0, and the gates of N-channel transistors N6 and N8 are connected to write bit lines /WB0 and WB0, respectively.

FIG. 13 is a timing chart for use in illustration of the operation of the conventional 2-port SRAM 6000 described in conjunction with FIGS. 11 and 12.

In FIG. 13, both a read access and a write access are made to the same memory cell row such as a memory cell row to which memory cells DM1 and DM2 belong.

In an initial state, read bit lines RB0, /RB0 are both precharged to power supply potential Vcc.

At time T0, the potential level of read word line RWL0 rises, and a read access operation to memory cell DM1 is started. The potential of one of the read bit lines, here the potential of read bit line RB0 falls, which generates a potential difference between read bit lines RB0 and /RB0. Meanwhile, regarding memory cell DM2, in response to read word line RWL0 attaining an "H" level, the potential of read bit line RB1 falls, which generates a potential difference between read bit lines RB1 and /RB1.

Then, at time T1, the potential level of write word line WWL0 rises, and a write access operation to memory cell DM2 is started. Here, writing circuit 6 treats the potential level of write bit line WB1 among write bit lines WB1 and /WB1 as an "H" level (power supply potential level) based on write data WD and writes the "H" level to the memory cell. In this case, in response to write word line WWL0 attaining an "H" level, transistors N5 and N7 in memory cell DM2 are in a conductive state. As a result, transistor N8 in memory cell DM2 conducts in response to the "H" level potential of write bit line WB1, and tries to lower the potential of the storage node /SN in memory cell DM2. However, since read word line RWL0 has attained an "H" level, read access transistor N4 in memory cell DM2 is in a conductive state. Therefore, read bit line /RB1 must be also discharged by write access transistors N7 and N8.

Meanwhile, on the side of storage node SN in memory cell DM2, access transistor N3 is in a conductive state, and therefore load transistor P1 in memory cell DM2 must charge not only storage node SN but also read bit line RB1.

Efforts are generally made to reduce the area occupied by transistors in a memory cell in order to achieve high density integration, and the transistor size is also small in SRAM 6000, and therefore the current driving capability is not large. In addition, a number of memory cells are typically connected to a read bit line, and the line capacitance is large. As a result, it takes very long between time T1 when a writing operation to memory cell DM2 is started and time T2 the potential difference between read bit lines RB1 and RB1 is inverted. P-channel transistors P1 and P2 in particular are not only small in size but also have current driving capability about half that of an N-channel transistor having the same size, and therefore the necessity of charging a read bit line with a load transistor is a great obstacle to reduction in access time.

SUMMARY OF THE INVENTION

One object of the present invention is to provide a semiconductor memory device which permits time required for writing data to be reduced when a read access and a write access are to be made at a time to the same memory cell row (word line) in a multi-port semiconductor memory device.

Briefly stated, the semiconductor memory device according to the present invention includes a memory cell array, a cell selecting circuit, read word lines, write word lines, a plurality of read bit line pairs, a plurality of write bit line pairs, and a bit line pair potential control circuit.

The memory cell array has a plurality of memory cells arranged in a matrix of rows and columns. The cell selecting circuit selects a memory cell in response to an externally applied address signal. The read word lines are provided corresponding to the memory cell rows and selectively activated in a reading operation under the control of the cell selecting circuit. The write word lines are provided corresponding to the memory cell rows and selectively activated in a writing operation under the control of the cell selecting circuit.

The plurality of read bit line pairs are provided corresponding to the memory cell columns and transmit storage data from a selected memory cell in a reading operation. The plurality of write bit line pairs are provided corresponding to the memory cell columns and transmit storage data to a selected memory cell in a writing operation.

The bit line pair potential control circuit can precharge a read bit line pair and supply a prescribed current to a read bit line pair at least in a reading operation.

Each of the memory cells includes a latch circuit which has first and second input/output nodes and holds one of first and second potentials, first and second read access transistors provided between the first and second input/output nodes and one and the other bit lines of a read bit line pair, respectively to conduct in response to an activation of a corresponding one of read word lines, a first write access transistor and a first storage level driving transistor provided in series between the first input/output node and the first potential and a second write access transistor and a second storage level driving transistor provided in series between the second input/output node and the first potential.

Preferably, the cell selecting circuit includes a convolution access detecting circuit to detect simultaneous designation of writing and reading operations to respective ones of a plurality of memory cells belonging to the same memory cell row in the memory cell array, and the bit line load circuit supplies a prescribed current to a read bit line pair based on a detection result of the convolution access detecting circuit.

Alternatively, the cell selecting circuit preferably includes a convolution access detecting circuit to detect simultaneous designation of writing and reading operations to respective ones of a plurality of memory cells belonging to the same memory cell row in the memory cell array and generate a precharge control signal, and the bit line pair potential control circuit includes a precharge circuit to precharge a read bit line pair and supply a prescribed current to a read bit line pair in a reading operation under the control of a precharge control signal.

Therefore, a main advantage of the present invention resides in that the potential level of a read bit line pair is maintained at a level equal to or higher than a prescribed intermediate level between the first and second potentials if a read word line is activated, so that if reading and writing operations are performed to a plurality of memory cells belonging to the same memory cell row at a time, access time required for a writing operation can be reduced.

Another advantage of the present invention resides in that when reading and writing operations are performed to a plurality of memory cells belonging to the same memory cell row at a time, a prescribed current is supplied to a read bit line pair, the current consumption can be restrained.

Yet another advantage of the present invention resides in that the area occupied by the circuit can be restrained because no bit line load circuit is provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
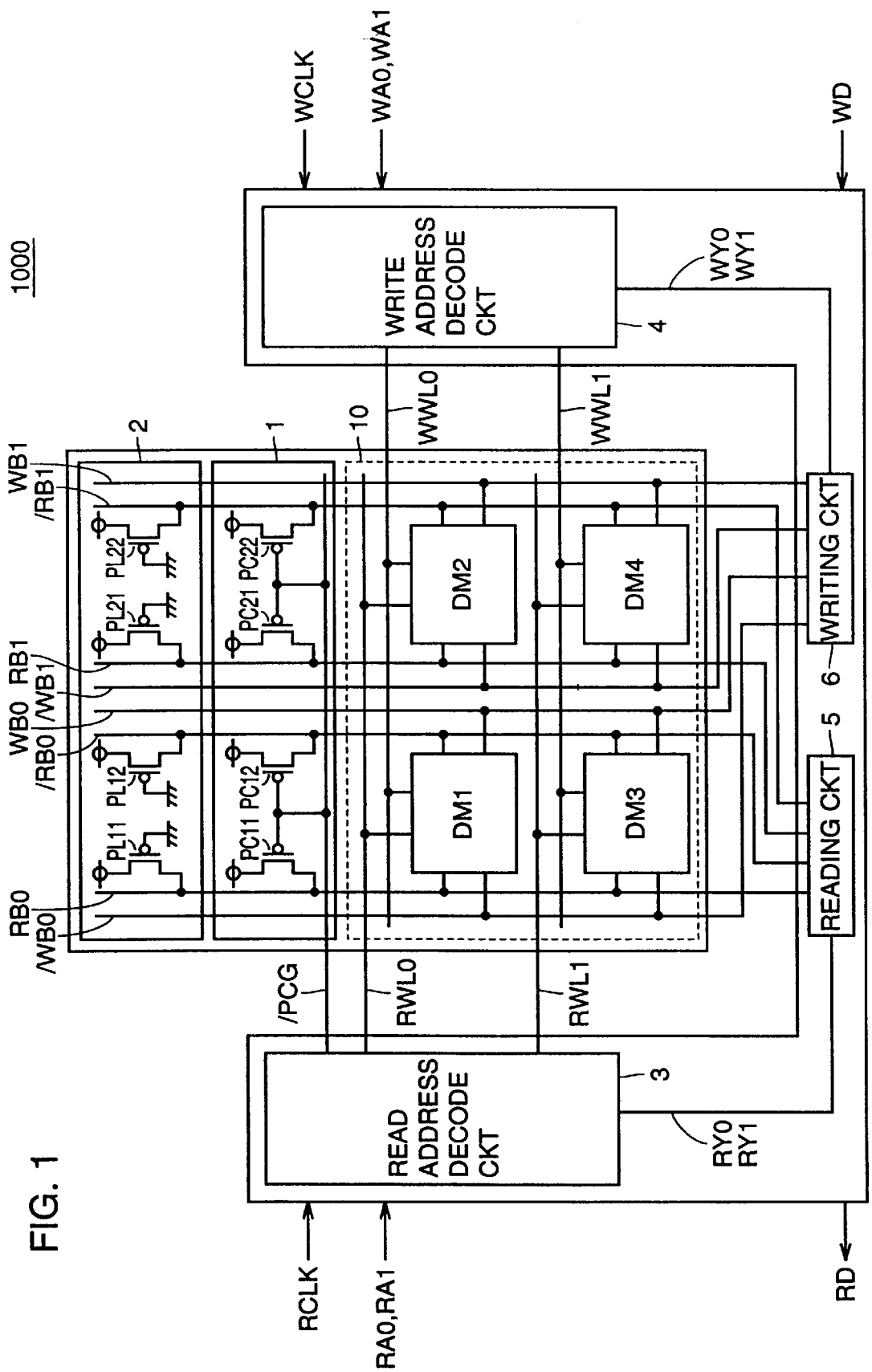
FIG. 1 is a schematic block diagram of the configuration of a 2-port static random access memory 1000 according to a first embodiment of the present invention.

FIG. 1 is a schematic block diagram of the configuration of a 2-port static random access memory 1000 according to a first embodiment of the present invention.

FIG. 1 also shows 2-port SRAM 1000 having memory cells corresponding to 4 bits in a matrix of two rows and two columns for ease of illustration. However as can be clearly appreciated from the following description, the present invention is not limited to such a configuration and is applicable to a multi-port SRAM having a larger number of memory cells arranged in a matrix of rows and columns.

Figure 12:
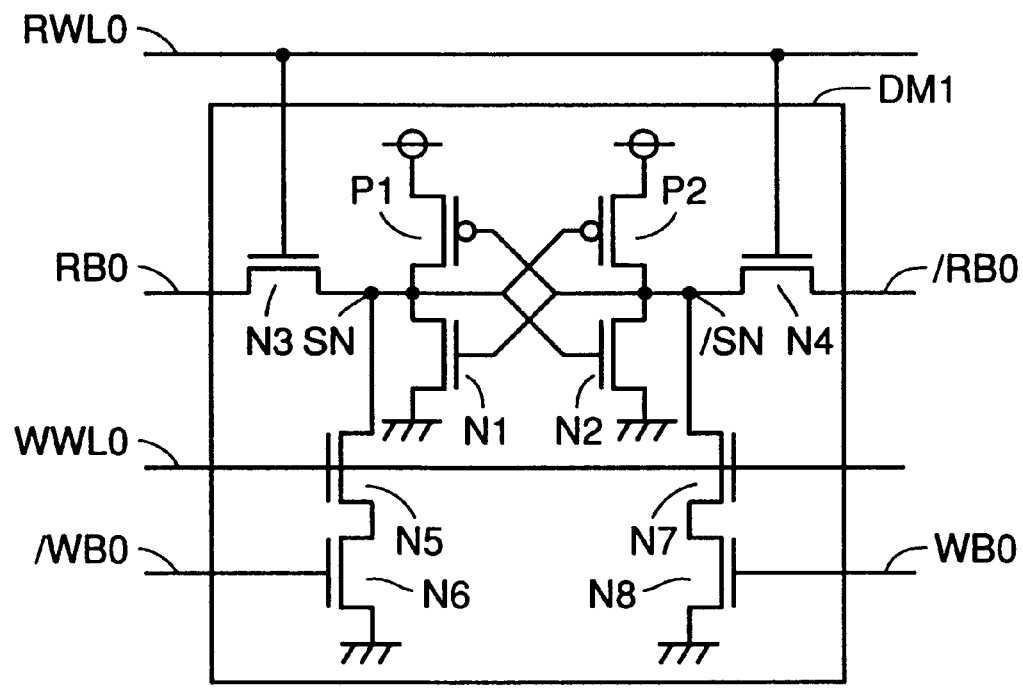
FIG. 12 is a circuit diagram of the configuration of memory cell DM1 shown in FIG. 11.

Referring to FIG. 1, 2-port SRAM 1000 includes a memory cell array 10 having memory cells DM1 to DM4 corresponding to 4 bits arranged in a matrix of two rows and two columns, read word line RWL0 and RWL1 provided corresponding to the rows of memory cells to select a row in memory cell array 10 at the time of reading data, write word lines WWL0 and WWL1 provided corresponding to the rows of memory cells to select a row in memory cell array 10 at the time of writing data, read bit lines RB0, /RB0 provided in common to memory cells DM1 and DM3 to read out data from these memory cells, read bit lines RB1, /RB1 provided in common to memory cells DM2 and DM4 to read out data from these memory cells, write bit lines WB0, /WB0 provided in common to memory cells DM1 and DM3 to write data to these memory cells, write bit lines WB1, /WB1 provided in common to memory cells DM2 and DM4 to write data to these memory cells, a precharge circuit 1 to charge read bit lines RB0, /RB0, RB1 and /RB1 under the control of a precharge signal /PCG, and a bit line load circuit 2 to continuously supply current to read bit lines RB0, /RB0, RB1 and /RB1 when SRAM 1000 is an active state. The configuration of memory cells DM1 to DM4 is the same as that of the conventional memory cells shown in FIG. 12.

More specifically, precharge circuit 1 includes a P-channel transistor PC 11 provided between power supply potential Vcc and bit line RB0 and having its gate potential controlled by signal /PCG, a P-channel transistor PC12 provided between power supply potential Vcc and bit line /RB0 and having its gate potential controlled by signal /PCG, a P-channel transistor PC21 provided between power supply potential Vcc and bit line RB1 and having its gate potential controlled by signal /PCG, and a P-channel transistor PC22 provided between power supply potential Vcc and bit line /RB1 and having its gate potential controlled by signal /PCG.

Meanwhile, bit line load circuit 2 includes a P-channel transistor PL11 provided between power supply potential Vcc and bit line RB0 and having its gate coupled to ground potential GND, a P-channel transistor PL12 provided between power supply potential Vcc and bit line /RB0 and having its gate coupled to ground potential GND, a P-channel transistor PL21 provided between power supply potential Vcc and bit line RB1 and having its gate coupled to ground potential GND, and a P-channel transistor PL22 provided between power supply potential Vcc and bit line /RB1 and having its gate coupled to ground potential GND.

Therefore, the sizes of transistors PL11, PL12, PL21 and PL22 can be adjusted to control the amount of current continuously supplied to a read bit line pair.

Two-port SRAM 1000 is externally provided with read clock signal RCLK and read address signal RA0, RA1, and read data RD is output in response to these signals. More specifically, read address decode circuit 3 receives read clock signal RCLK and read address signal RA0, RA1, selects read word line RWL0 or RWL1 and outputs read column select signal RY0, RY1 to select a read bit line and precharge signal /PCG to control precharge circuit 1. Reading circuit 5 amplifies the potential of a read bit line and outputs read data RD.

Meanwhile, 2-port SRAM 1000 is externally provided with write clock signal WCLK and write address signal WA0, WA1, and write data WD is stored in response to these signals. More specifically, write address decode circuit 4 receives write clock signal WCLK, write address signal WA0, WA1, selects word line WWL0 or WWL1 and outputs write column select signal WY0, WY1 to select a write bit line. Writing circuit 6 writes write data WD into a selected memory cell through the write bit line.

In two-port SRAM 1000, read word lines RWL0, RWL1 and read bit line pairs RB0, /RB0 and RB1, /RB1 to control a reading operation, write word lines WWL0, WWL1 and write bit line pairs WB0, /WB0 and WB1, /WB1 to control a writing operation are provided independently from each other, so that read address decode circuit 3 and reading circuit 5, and write address decode circuit 4 and writing circuit 6 can be controlled independently from each other to achieve a writing operation and a reading operation simultaneously and independently to each memory cell. In particular, a reading operation can be performed to one memory cell while a writing operation can be performed to another memory cell at the same time among memory cells belonging to the same memory cell row.

Figure 2:
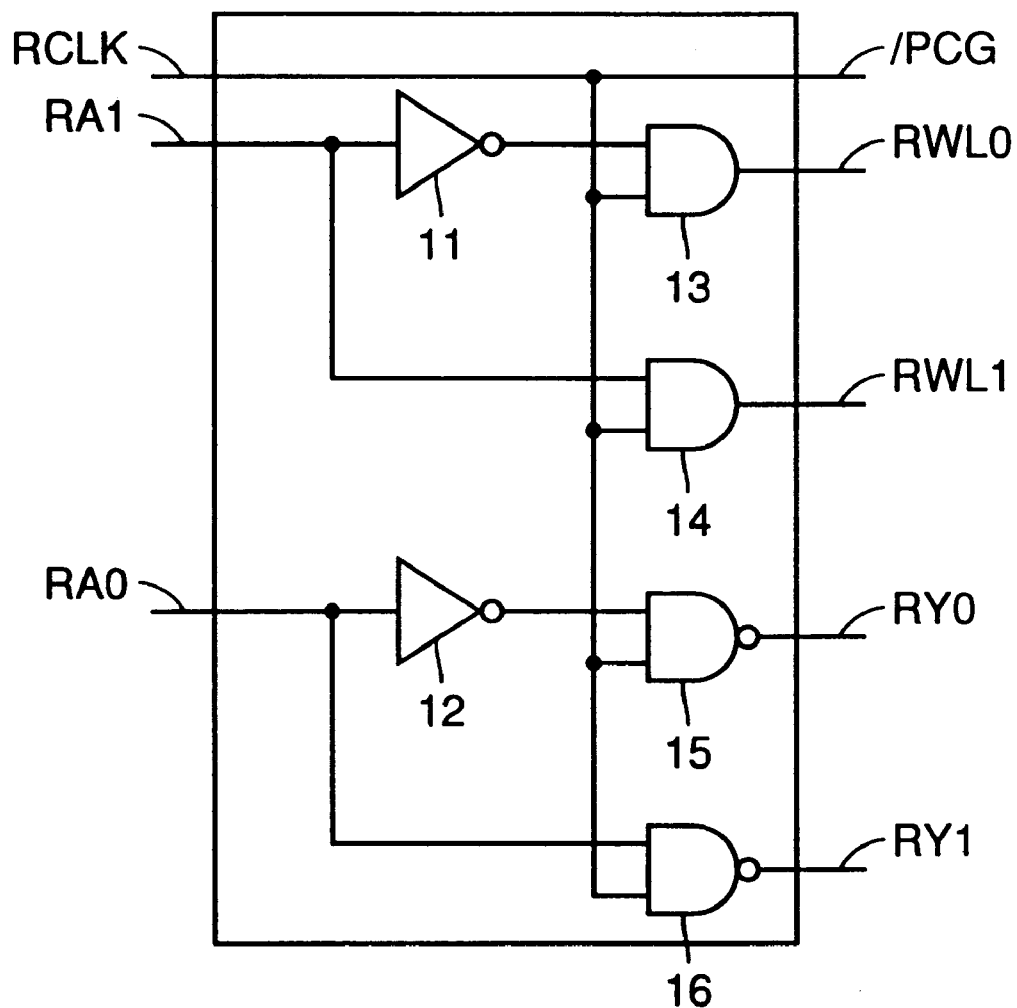
FIG. 2 is a circuit diagram of the configuration of a read address decode circuit 3 shown in FIG. 1.

FIG. 2 is a circuit diagram of the configuration of a read address decode circuit 3 shown in FIG. 1.

Referring to FIG. 2, read address decode circuit 3 includes an inverter 11 which receives and inverts address signal RA1, an inverter 12 which receives and inverts address signal RA0, an AND circuit 13 which receives read clock signal RCLK activated in a reading operation and the output of inverter 11 and drives the potential of read word line RWL0, an AND circuit 14 which receives read clock signal RCLK and address signal RA1 and drives the potential of read word line RWL1, a NAND circuit 15 which receives read clock signal RCLK and the output of inverter 12 and outputs read column select signal RY0, and a NAND circuit 16 which receives read clock signal RCLK and address signal RA0 and outputs read column select signal RY1.

Read address decode circuit 3 outputs read clock signal RCLK as precharge signal /PCG.

Figure 3:
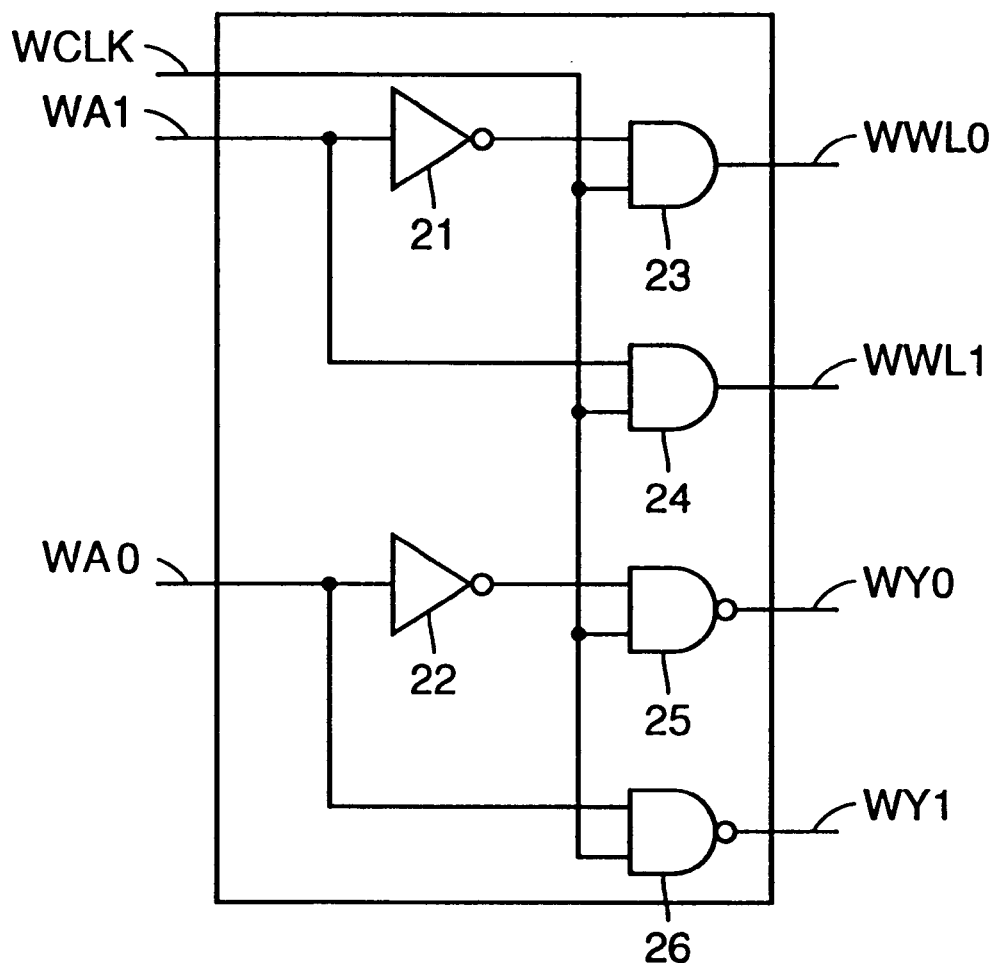
FIG. 3 is a circuit diagram of the configuration of a write address decode circuit 4 shown in FIG. 1.

FIG. 3 is a circuit diagram of the configuration of write address decode circuit 4 shown in FIG. 1.

Referring to FIG. 3, write address decode circuit 4 includes an inverter 21 which receives and inverts address signal WA1, an inverter 22 which receives and inverts address signal WA0, an AND circuit 23 which receives write clock signal WCLK activated in a reading operation and the output of inverter 21 and drives the potential of write word line WWL0, an AND circuit 24 which receives write clock signal WCLK and address signal WA1 and drives the potential of write word line WWL1, a NAND circuit 25 which receives write clock signal WCLK and the output of inverter 22 and outputs write column select signal WY0, and a NAND circuit 26 which receives write clock signal WCLK and address signal WA0 and outputs write column select signal WY1.

Figure 4:
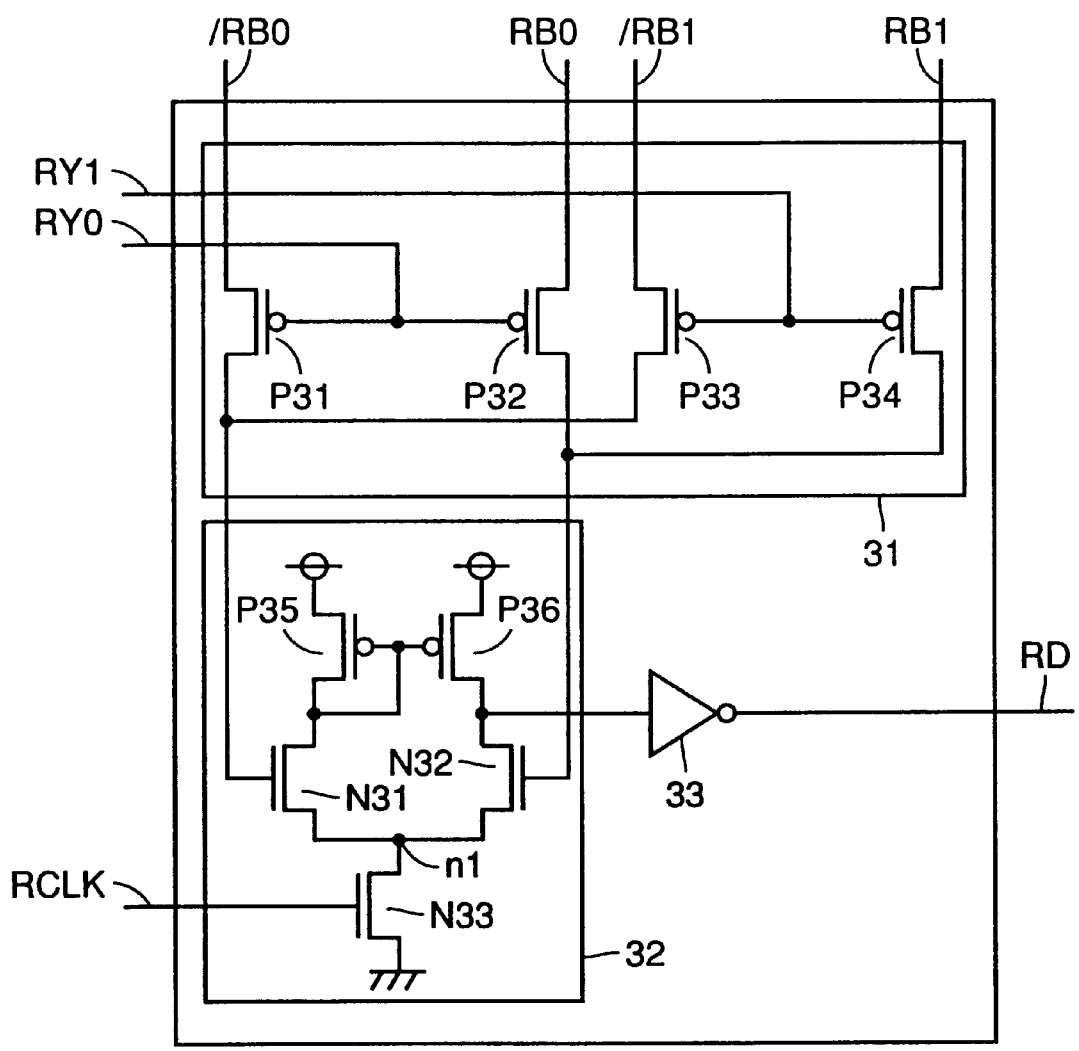
FIG. 4 is a circuit diagram of the configuration of a reading circuit 5 shown in FIG. 1.

FIG. 4 is a circuit diagram of the configuration of reading circuit 5 shown in FIG. 1.

Referring to FIG. 4, reading circuit 5 includes a selecting circuit 31 which selects read bit line pair RB0, /RB0 or read bit line pair RB1, /RB1 in response to read column select signal RY0, RY1, a current mirror type sense amplifier circuit 32 to amplify signals on a selected bit line pair, and an inverter 33 which inverts the output of sense amplifier circuit 32 and outputs read data RD.

Selecting circuit 31 includes a P-channel transistor P31 provided between bit line /RB0 and one input node of sense amplifier 32 and having its gate potential controlled by signal RY0, a P-channel transistor P32 provided between bit line RB0 and the other input node of sense amplifier 32 and having its gate potential controlled by signal RY0, a P-channel transistor P33 provided between bit line /RB1 and that one input node of sense amplifier 32 and having its gate potential controlled by signal RY1, and a P-channel transistor P34 provided between bit line RB1 and the other input node of sense amplifier 32 and having its gate potential controlled by signal RY1.

Sense amplifier 32 includes a P-channel transistor P35 and an N-channel transistor N31 connected in series between an internal node n1 and power supply potential Vcc, a P-channel transistor P36 and an N-channel transistor N32 connected in series between internal node n1 and power supply potential Vcc, and an N-channel transistor N33 provided between internal node n1 and ground potential GND and receiving read clock signal RCLK at its gate.

The gates of P-channel transistors P35 and P36 are coupled, and the gate of transistor P35 is coupled to the drain of transistor P35.

The gates of N-channel transistors N3 1 and N32 are coupled to the one and other ends of sense amplifier 32, respectively.

The connection node of transistors P36 and N32 serves as the output node of sense amplifier 32 and is coupled to the input node of inverter 33.

In a read access, read address decode circuit 3 selects a read word line corresponding to read address signal RA0, RA1 in synchronization with read clock signal RCLK and selectively activates read column select signal RY0, RY1. At this time, precharge circuit 1 which has precharged a read bit line pair according to precharge signal /PCG is inactivated and the supply of the precharge potential to the read bit line pair is stopped. When read access transistors N3 and N4 in a selected memory cell conduct, the levels of storage nodes SN and /SN are transmitted to corresponding read bit line pairs. Reading circuit 5 amplifies the potential difference appearing on the selected read bit line pair and outputs the result as read data RD.

Figure 5:
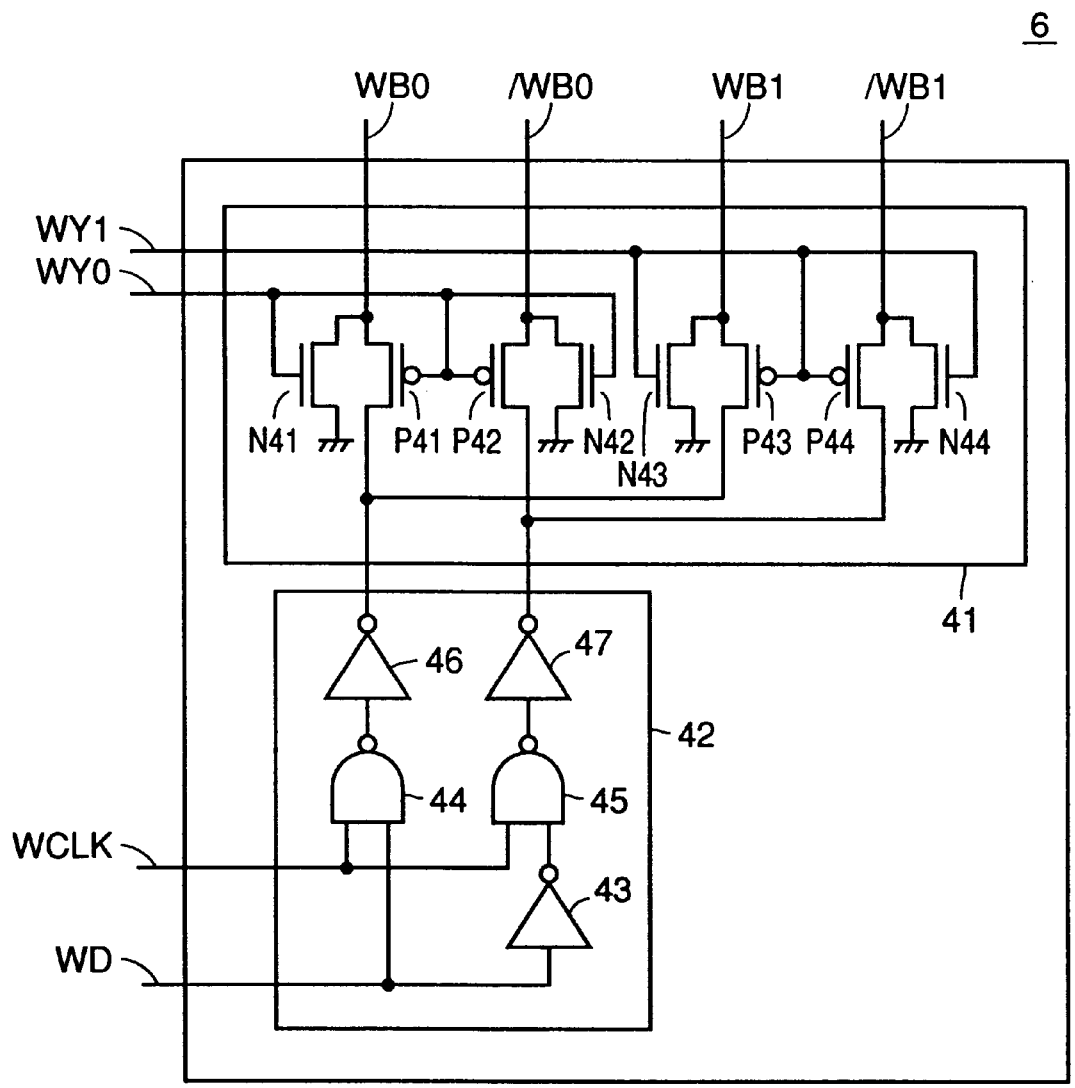
FIG. 5 is a circuit diagram of the configuration of a writing circuit 6 shown in FIG. 1.

FIG. 5 is a circuit diagram of the configuration of writing circuit 6 shown in FIG. 1.

Referring to FIG. 5, writing circuit 6 includes a selecting circuit 41 which selects write bit line pair WB0, /WB0 or write bit line pair WB1 or /WB1 in response to write column select signal WY0, WY1 and fixes the potential level of a non-selected write bit line pair at the ground potential level, and a write driver circuit 42 to transmit writing data WD to the selected write bit line pair.

Selecting circuit 41 includes a P-channel transistor P41 provided between write bit line WB0 and one output node of write driver circuit 42 and having its gate potential controlled by signal WY0, an N-channel transistor N41 provided between write bit line WB0 and ground potential GND and having its gate potential controlled by signal WY0, a P-channel transistor P42 provided between write bit line /WB0 and the other output node of write driver circuit 42 and having its gate potential controlled by signal WY0, an N-channel transistor N42 provided between write bit line /WB0 and ground potential GND and having its gate potential controlled by signal WY0, a P-channel transistor P43 provided between write bit line WB1 and one output node of write driver circuit 42 and having its gate potential controlled by signal WY1, an N-channel transistor N43 provided between write bit line WB1 and ground potential GND and having its gate potential controlled by signal WY1, a P-channel transistor P44 provided between write bit line /WB1 and the other output node of write driver circuit 42 and having its gate potential controlled by signal WY1, and an N-channel transistor N44 provided between write bit line /WB1 and ground potential GND and having its gate potential controlled by signal VY1.

Write driver circuit 42 includes an inverter 43 which receives and inverts write data WD, a NAND circuit 44 which receives write clock signal WCLK and write data WD, an inverter 46 which receives and inverts the output of NAND circuit 44 for application to one output node of write driver 42, a NAND circuit 45 which receives write clock signal WCLK and the output of inverter 43 and an inverter 47 which receives and inverts the output of NAND circuit 45 for application to the other output node of write driver circuit 42.

In a write access, write address decode circuit 4 selects a write word line corresponding to write address signal WA0, WA1 in synchronization with write clock signal WCLK and selectively activates write column select signal WY0, WY1.

Writing circuit 6 transmits write data WD to a selected write bit line pair and pulls the potential of one of write bit line pair WB0, /WB0, the potential of bit line WB0 for example to an "H" level, if write bit line pair WB0, /WB0 is selected. When N type transistors N7 and N8 in a selected memory cell conduct, the potential of storage node /SN is discharged to the ground potential, and data "H" is written to storage node SN.

Figure 6:
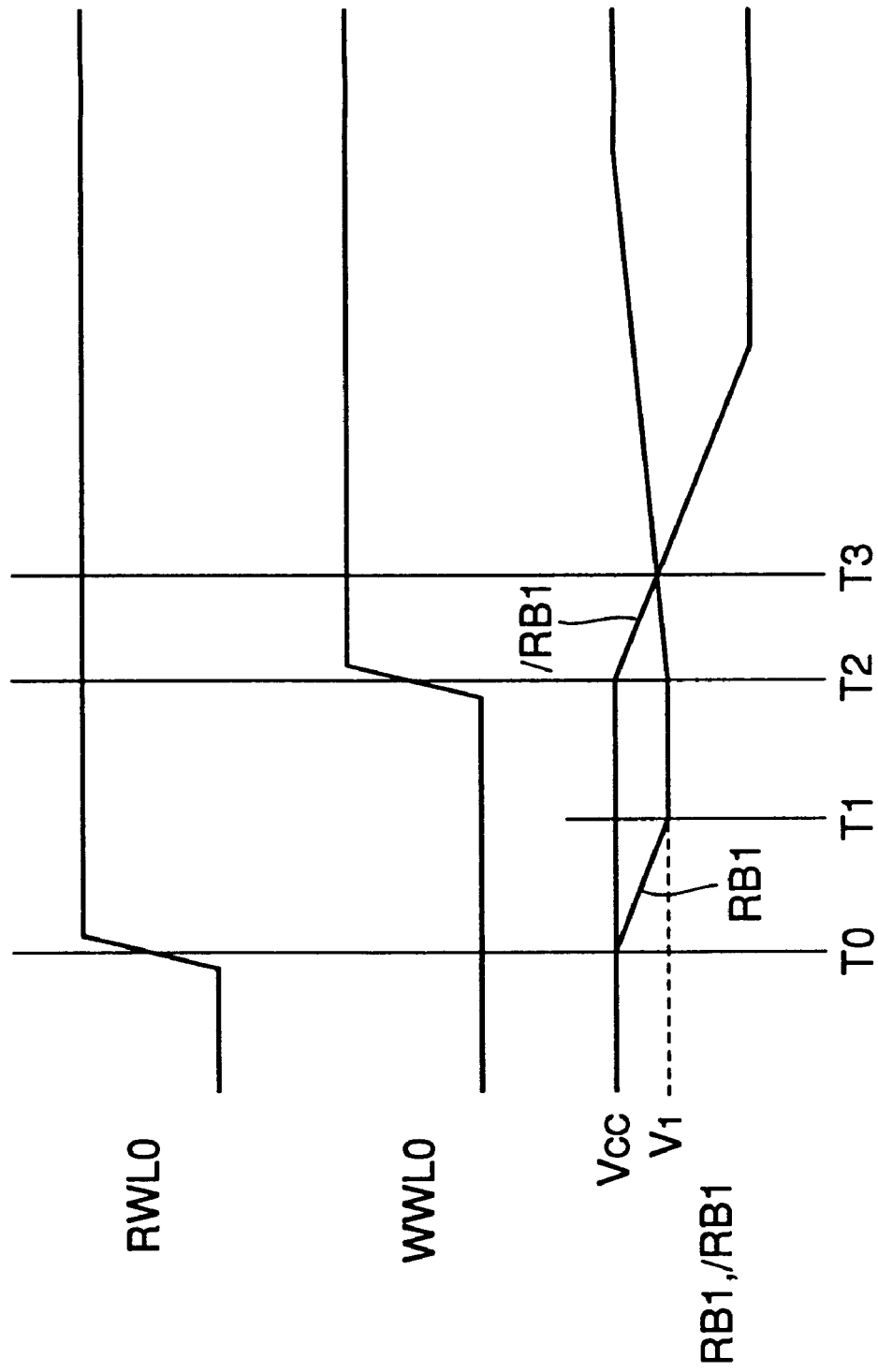
FIG. 6 is a timing chart for use in illustration of the operation of SRAM 1000 shown in FIG. 1.
Figure 13:
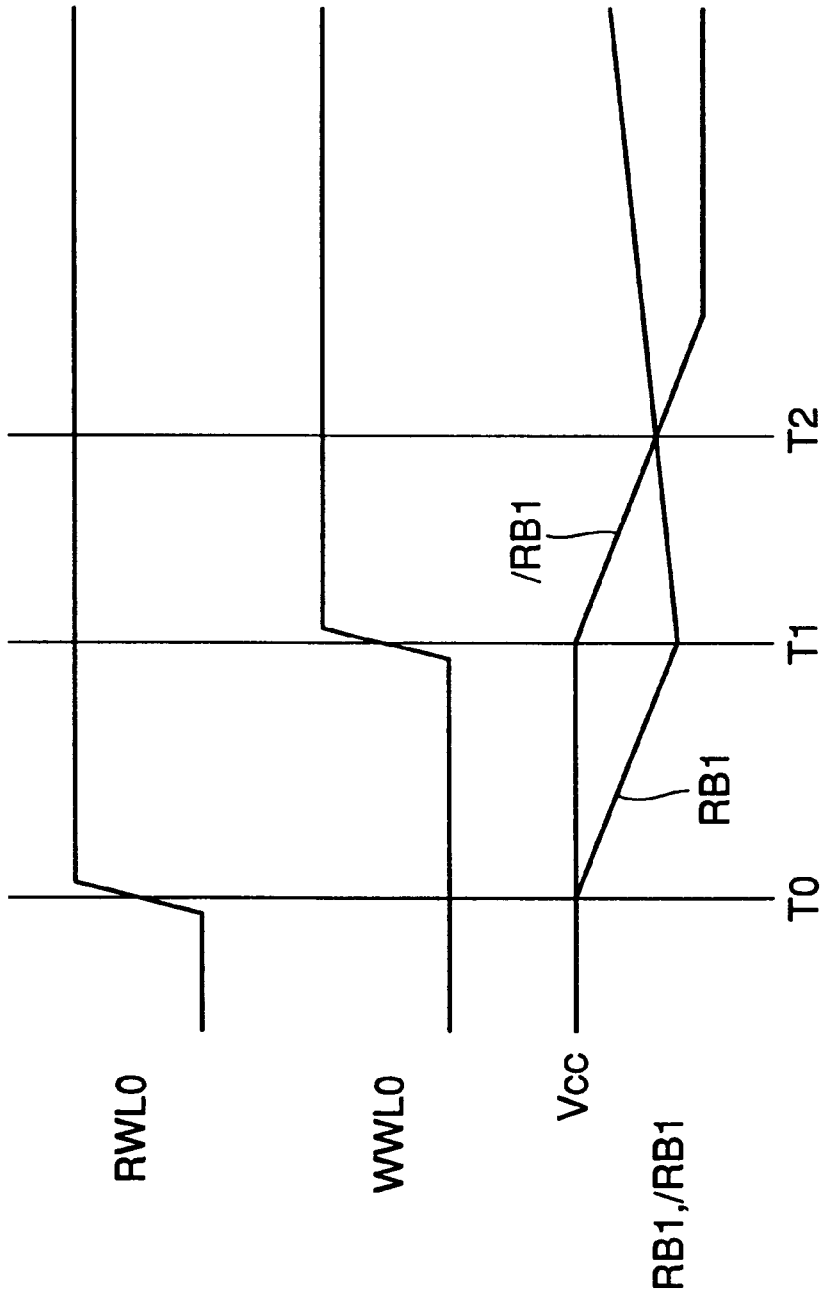
FIG. 13 is a timing chart for use in illustration of the operation of conventional 2-port SRAM 6000.

FIG. 6 is a timing chart for use in illustration of SRAM 1000 shown in FIG. 1 and FIG. 6 is to be compared to FIG. 13.

FIG. 6 also shows the operation in which both a read access and a write access are performed at the same time for example to a memory cell row to which memory cells DM1 and DM2 belong.

In an initial state, read bit lines RB0 and /RB0 are both precharged to power supply potential Vcc.

At time T0, the potential level of read word line RWL0 rises, and a read access operation to memory cell DM1 is started. The potential of one read bit line, read bit line RB0 here falls, and a potential difference is generated between read bit lines RB0 and /RB0. Meanwhile, regarding memory cell DM2, in response to read word line RWL0 attaining an "H" level, the potential of read bit line RB1 falls, and a potential difference is generated between read bit lines RB1 and /RB1.

At this time, since P-channel transistors PL11 to PL21 in bit line load circuit 2 are continuously in a conductive state, the potential level of read bit line RB0 or RB1 which has fallen stops falling at time T1 at the level of potential V1 determined based on the resistance ratio of P-channel transistor PL11 or PL21 in bit line load circuit 2, read access transistor N3 and driver transistor N1 in the memory cell.

At time T2, the potential level of write word line WWL0 rises, and a write access operation to memory cell DM2 is started. Here, writing circuit 6 pulls the potential level of write bit line WB1 among write bit lines WB1 and IWB1 to an "H" level (power supply potential level) based on write data WD, and writes the "H" level to the memory cell. At this time, in response to write word line WWL0 attaining an "H" level, transistors N5 and N7 in memory cell DM2 are in a conductive state. Therefore, transistor N8 in memory cell DM2 conducts in response to the potential of write bit line WB1 being at the "H" level, and functions to lower the potential of storage node /SN in memory cell DM2. Here, since read word line RWL0 is at the "H" level, read access transistor N4 is in a conductive state. Therefore, read bit line /RB1 is also discharged by write access transistor N7 and transistor N8. Meanwhile, on the side of storage node SN in memory cell DM2, access transistor N3 is in a conductive state, and therefore load transistor P1 in memory cell DM2 charges not only storage node SN but also read bit line RB1.

However, the potential at time T1 is at an intermediate potential V1 between ground potential GND and power supply potential Vcc, the period between time T2 when the potential of the write word line is selectively driven and time T3 when the potential of bit line RB1 crosses the potential level of bit line /RB1 for writing data is shorter than the conventional case shown in FIG. 13.

Here, potential V1 at which the potential of the read bit line lowered stops falling is preferably higher than the threshold voltage of the inverter circuit forming the latch circuit in the memory cell.

This is for the following reason. More specifically, referring back to FIG. 12, when data "H" is written to storage node SN, N-channel transistors N7 and N8 are allowed to conduct and then the potential level of storage node /SN is lowered. As a result, load transistor P1 conducts and storage node SN is charged. In the above process, the potential of storage node /SN is prevented from falling by current from load transistor P2. In order to reduce the influence of load transistor P2 and improve the writing speed, the potential level of storage node SN to be coupled to the gate of transistor P2 has only to be at a high level. More specifically, if the potential of read bit line RB0 is set higher than the threshold voltage of the inverters in the memory cell, time required for lowering the potential level of storage node /SN is reduced, and time required for charging storage node SN and read bit line RB0 is reduced as a result.

Therefore, in SRAM 1000 according to the first embodiment, time required for writing data if a read access and a write access are to be performed to the same memory cell row (word line) at the same time can be reduced by employing the configuration described above.

Second Embodiment

Figure 7:
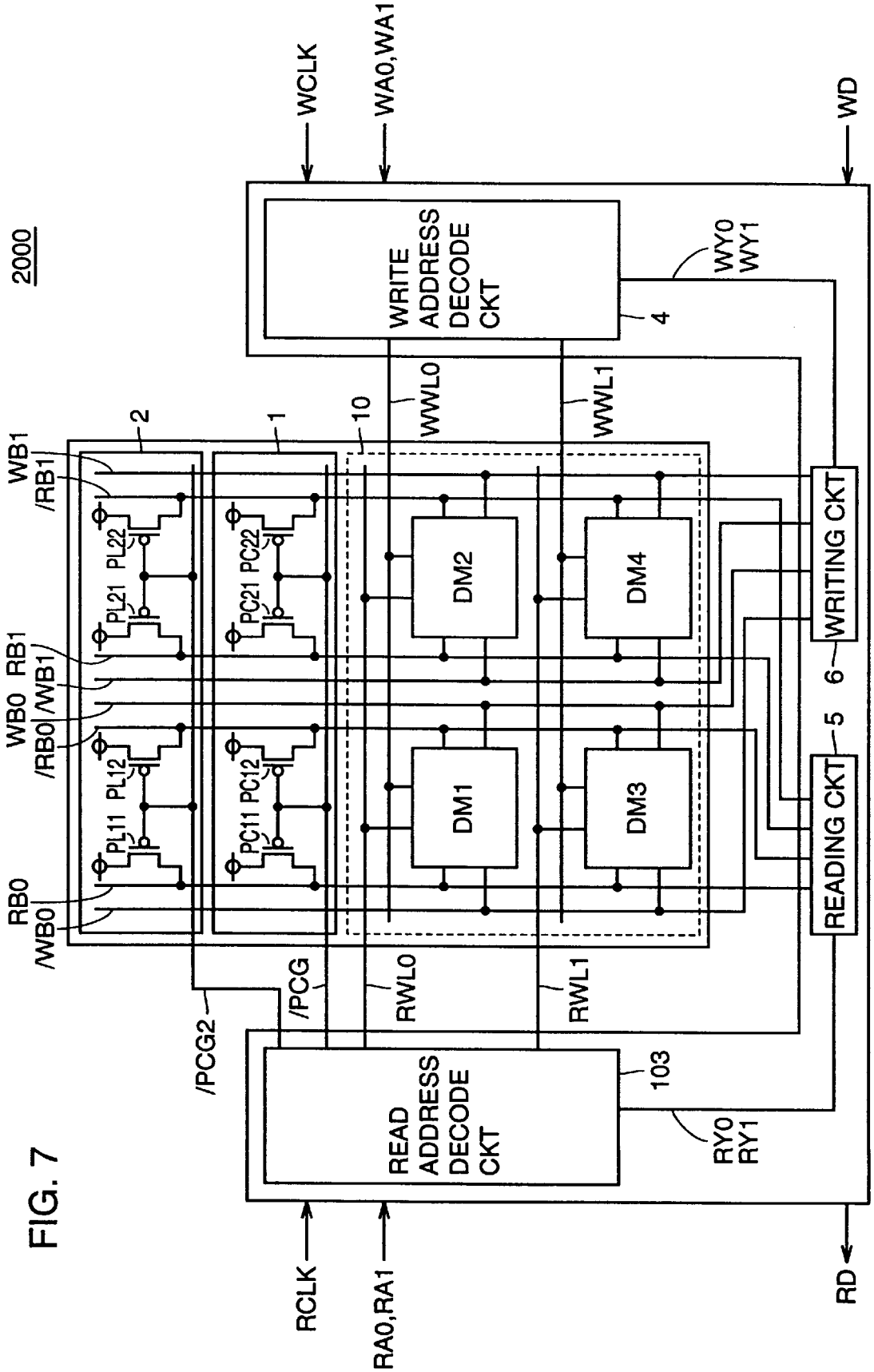
FIG. 7 is a schematic block diagram of the configuration of 2-port SRAM 2000 according to a second embodiment of the present invention.

FIG. 7 is a schematic block diagram of the configuration of a 2-port SRAM 2000 according to a second embodiment of the present invention.

The second embodiment is different from 2-port SRAM 1000 according to the first embodiment shown in FIG. 1 in that read address decode circuit 103 receives write address signal WA1 to address a row selection among write address signals in addition to read clock signal RCLK, and read address signal RA0, RA1 and selects read word line RWL0 or RWL1, selectively activates read column select signal RY0 or RY1, and outputs not only precharge signal /PCG to precharge circuit 1 but also a second precharge signal /PCG2.

Furthermore, in SRAM 2000, a bit line load circuit 102 is controlled by second precharge signal /PCG2.

The other points are the same as those of the configuration of SRAM 1000 according to the first embodiment, the same portions are denoted with the same reference characters and the description is not repeated.

Bit line load circuit 102 includes a P-channel transistor PL11 provided between power supply potential Vcc and bit line RB0 and having its gate potential controlled by signal /PCG2, a P-channel transistor PL12 provided between power supply potential Vcc and bit line /RB0 and having its gate potential controlled by signal /PCG2, a P-channel transistor PL21 provided between power supply potential Vcc and bit line RB1 and having its gate potential controlled by signal /PCG2, and a P-channel transistor PL22 provided between power supply potential Vcc and bit line /RB1 and having its gate potential controlled by signal /PCG2.

Figure 8:
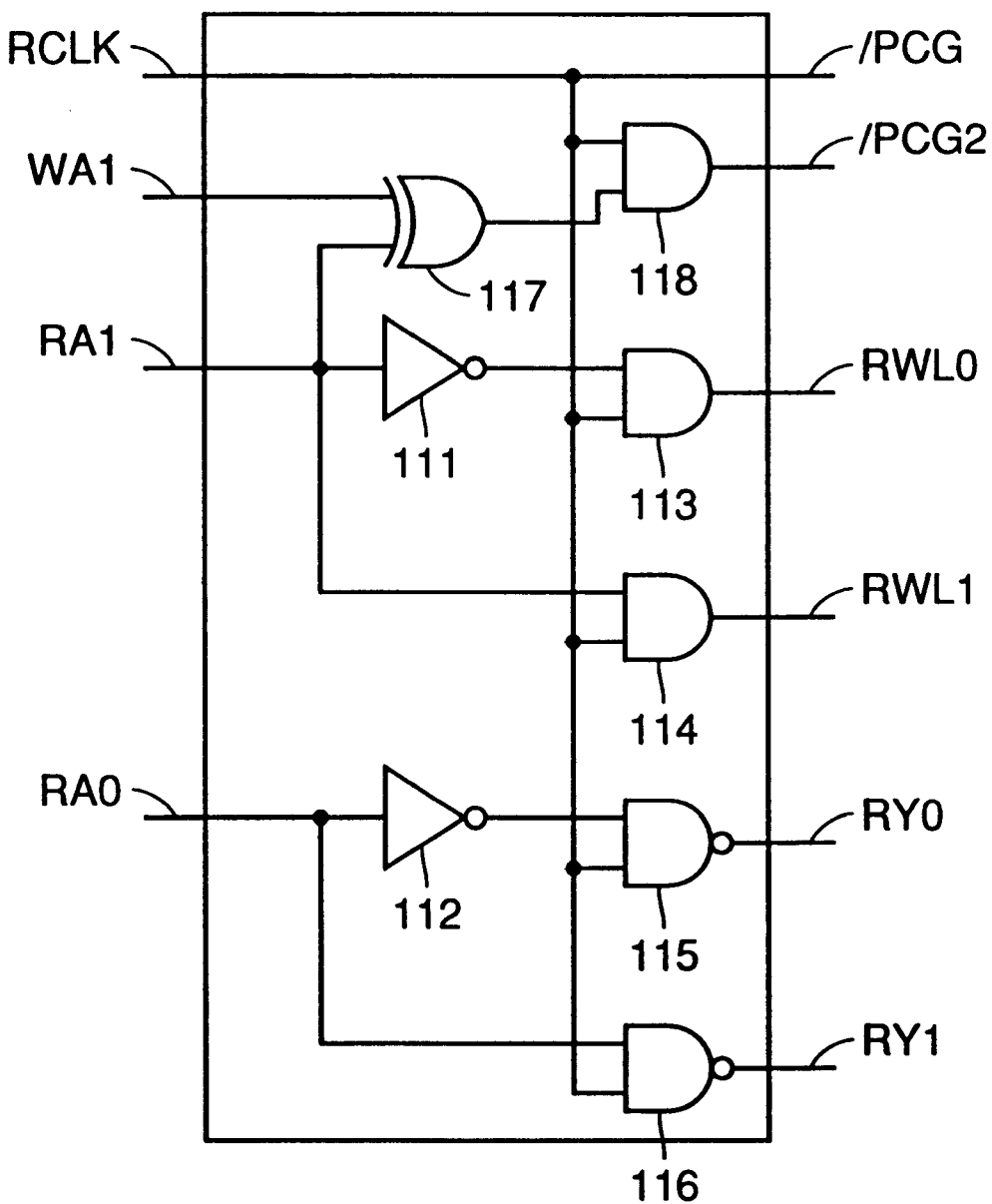
FIG. 8 is a circuit diagram of the configuration of a read address decode circuit 103 shown in FIG. 7.

FIG. 8 is a circuit diagram showing the configuration of a read address decode circuit 103 shown in FIG. 7.

Referring to FIG. 8, read address decode circuit 103 includes an inverter 111 which receives and inverts address signal RA1, an inverter 112 which receives and inverts address signal RA0, an AND circuit 113 which receives read clock signal RCLK activated in a reading operation and the output of inverter 111 and drives the potential of read word line RWL0, an AND circuit 114 which receives read clock signal RCLK and address signal RA1 and drives the potential of read word line RWL1, a NAND circuit 115 which receives read clock signal RCLK and the output of inverter 112 and outputs read column select signal RY0, a NAND circuit 116 which receives read clock signal RCLK and address signal RA0 and outputs read column select signal RY1, an EXOR circuit 117 which receives read address signal RA1 and write address signal WA1 and performs an XOR operation, and an AND circuit 118 which receives read clock signal RCLK and the output of EXOR circuit 117 and outputs second precharge signal /PCG2.

The operation of SRAM 2000 will be now described.

When a read access operation and a write access operation are both performed to memory cells belonging to the same row such as memory cells DM1 and DM2 at the same time, read address signal RA1 and write address signal WA1 have the same value, and therefore the output level of EXOR circuit 117 is at an "L" level. Signal /PCG2 from AND circuit 118 is also at an "L" level accordingly. At this time, P-channel transistors PL11 to PL22 in bit load circuit 102 all attain a conductive state. As a result, the operation of SRAM 2000 in this case is the same as the operation of SRAM 1000 according to the first embodiment. More specifically, similarly to the operation of SRAM 1000 according to the first embodiment, the potential of the read bit line whose potential level is lowered among the read bit line pair stops falling at the level of intermediate potential V1 between power supply potential Vcc and ground potential GND. The size of transistors PL11 to PL22 is designed to attain a desired potential level V1 similarly to the first embodiment.

Meanwhile, in the other cases, in other words, if read address RA1 and write address WA1 are different, the output level of EXOR circuit 117 is pulled to an "H" level. Accordingly, in a reading operation, more specifically, when read clock signal RCLK is in an active state ("H" level), signal /PCG2 from AND circuit 118 also attains an "H" level. At this time, P-channel transistors PL11 to PL22 in bit line load circuit 102 are all disconnected. Therefore, the operation of SRAM 2000 is the same as that of conventional SRAM 6000.

In the above configuration, when a reading operation and a writing operation are performed to memory cells belonging to the same row at the same time, P-channel transistors PL11 to PL22 in bit line load circuit 103 conduct, which prevents the potential level of the read bit line from being lowered to the ground potential level and therefore data can be written to a selected memory cell in a short period of time.

In addition, bit line load circuit 103 is not activated unless reading and writing to memory cells belonging to the same row are performed at the same time, and therefore the power consumption can be restrained.

Third Embodiment

Figure 9:
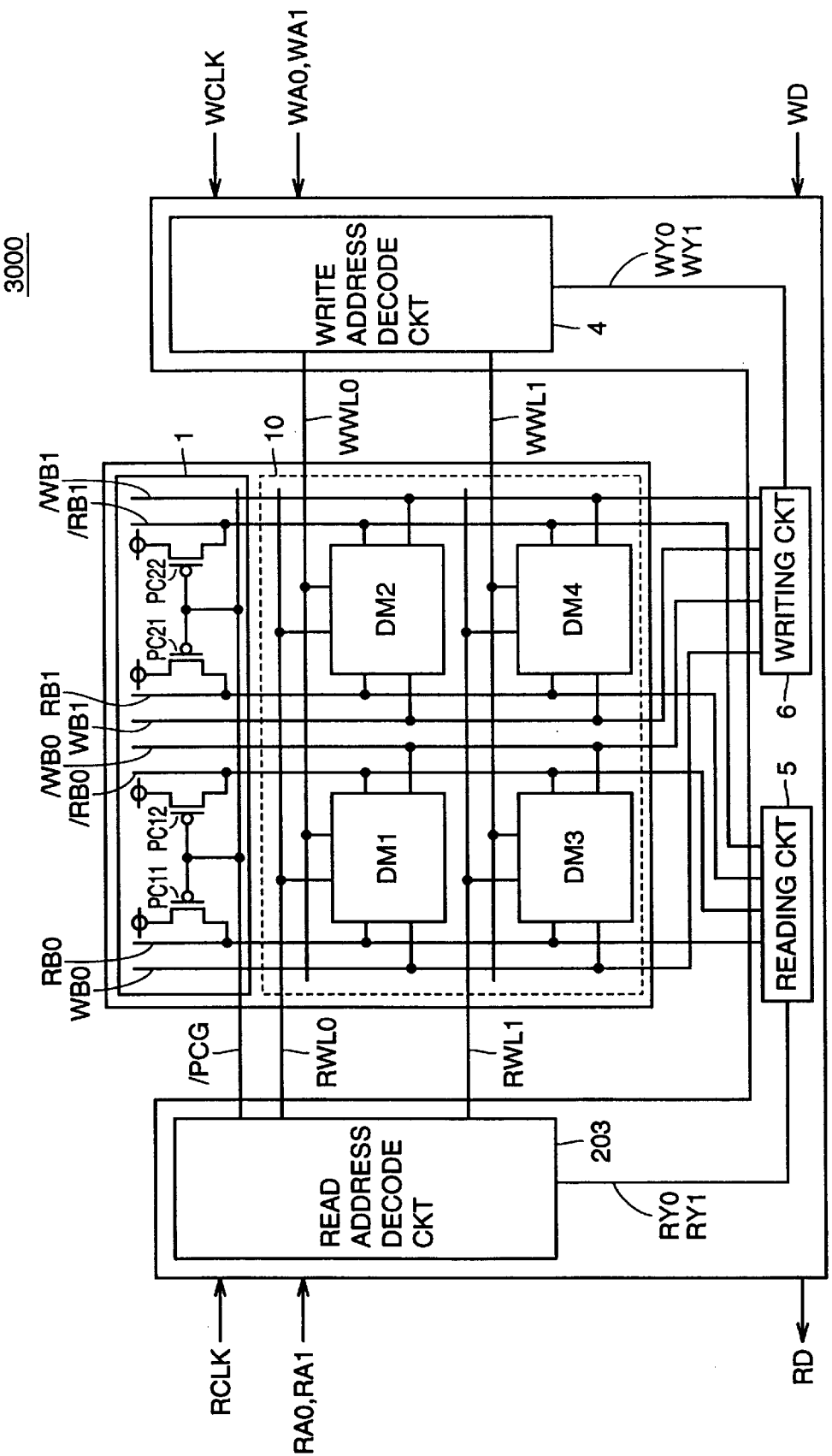
FIG. 9 is a schematic block diagram of the configuration of a 2-port SRAM 3000 according to a third embodiment of the present invention.

FIG. 9 is a schematic block diagram of the configuration of a 2-port SRAM 3000 according to a third embodiment of the present invention.

Two-port SRAM 3000 is different from 2-port SRAM 1000 according to the first embodiment shown in FIG. 1 in that a read decode address circuit 203 receives write address signal WA1 to address a row selection among write address signals in addition to read clock signal RCLK and read address signal RA0, RA1, selects read word line RWL0 or RWL1, selectively activates read column select signal RY0 or RY1, and outputs precharge signal /PCG to precharge circuit 1.

Furthermore, in SRAM 3000, bit line load circuit 2 is not provided.

The other points are the same as those of SRAM 1000 according to the first embodiment and therefore the description is not repeated.

Figure 10:
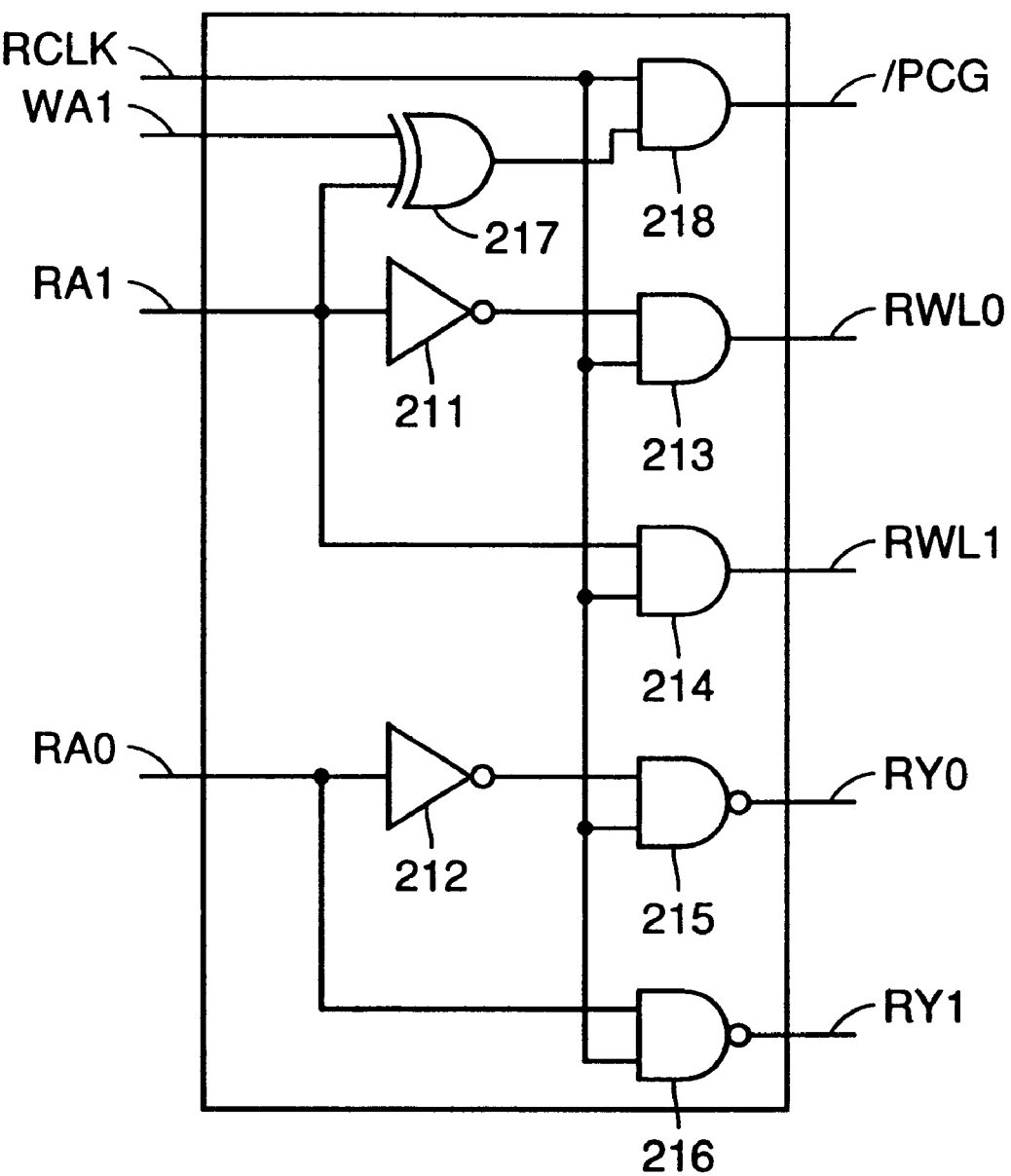
FIG. 10 is a circuit diagram of the configuration of a read address decode circuit 203 shown in FIG. 9.
Figure 11:
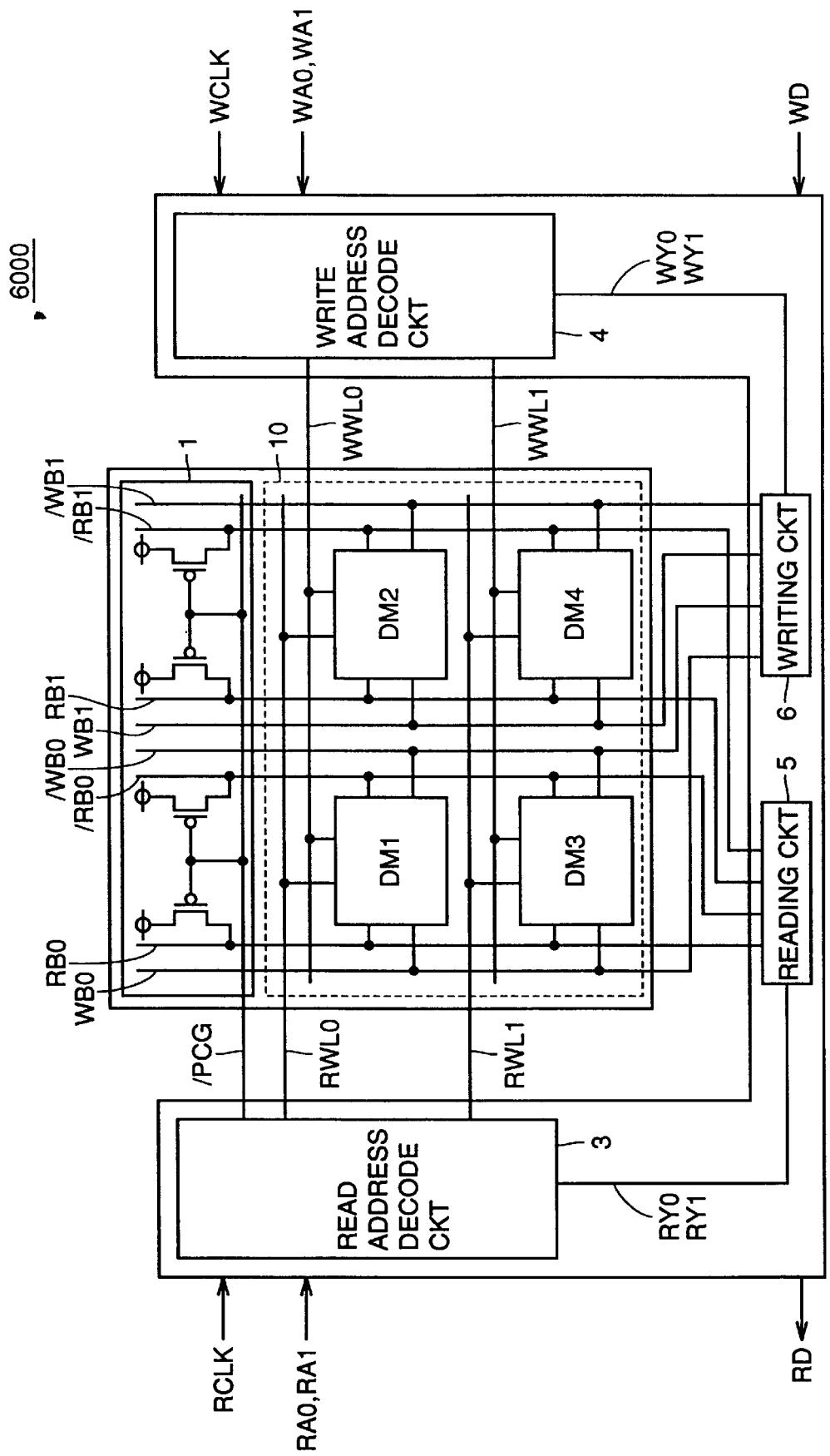
FIG. 11 is a schematic block diagram of the configuration of conventional 2-port SRAM 6000.

FIG. 10 is a circuit diagram of the configuration of read address decode circuit 203 shown in FIG. 9.

Referring to FIG. 10, read address decode circuit 203 includes an inverter 211 which receives and inverts address signal RA1, an inverter 212 which receives and inverts address signal RA0, an AND circuit 213 which receives read clock signal RCLK activated in a reading operation and the output of inverter 211 and drives the potential of read word line RWL0, an AND circuit 214 which receives read clock signal RCLK and address signal RA1 and drives the potential of read word line RWL1, a NAND circuit 215 which receives read clock signal RCLK and the output of inverter 212 and outputs read column signal RY0, a NAND circuit 216 which receives read clock signal RCLK and address signal RA0 and outputs read column select signal RY1, an EXOR circuit 217 which receives read address signal RA1 and write address signal WA1 and performs an XOR operation, and an AND circuit 218 which receives read clock signal RCLK and the output of EXOR circuit 217 and outputs precharge signal /PCG.

The operation of SRAM 2000 will be now described.

When a read access operation and a write access operation are to be performed at the same time to memory cells belonging to the same row such as memory cells DM1 and DM2, read address signal RA1 and write address signal WA1 have the same value, and therefore the output level of EXOR circuit 217 is an "L" level. Signal /PCG from AND circuit 218 attains an "L" level accordingly. At this time, P-channel transistors PC11 to PC22 in precharge circuit 1 are all in a conductive state. Therefore, the operation of SRAM 3000 is similar to the operation of SRAM 1000 according to the first embodiment in this case, and the potential of the read bit line whose potential level is lowered among the read bit line pair stops falling at the level of intermediate potential V1 between power supply potential Vcc and ground potential GND. Transistors PC11 to PC22 are designed to have such a size to attain desired potential level V1 similarly to the first embodiment.

Meanwhile, in the other cases, in other words, when read address RA1 and write address WA1 are different, the output level of EXOR circuit 217 is an "H" level. In a reading operation, in other words, when read clock signal RCLK is in an active state ("H" level), signal /PCG from AND circuit 218 also attains an "H" level accordingly. At this time, transistors PC11 to PC22 are all disconnected. Therefore, the operation of SRAM 3000 in this case is the same as that of conventional SRAM 6000.

When a reading operation and a writing operation are performed to memory cells belonging to the same row at the same time, P-channel transistors PC11 to PC22 in precharge circuit 1 conduct, which prevents the potential of the read bit line from being lowered to the level of the ground potential, and therefore data can be written to a selected memory cell in a shorter period of time.

Furthermore, precharge circuit 1 is not activated in a reading operation unless a writing operation and a reading operation are performed to memory cells belonging to the same row, and therefore the power consumption can be restrained. In addition, since the bit line load circuit is not necessary, the circuit area can be restrained as well.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory cell array having a plurality of memory cells arranged in a matrix of rows and columns;
   a cell select circuit to select said memory cell in response to an externally applied address signal;
   a plurality of read word lines provided corresponding respectively to said memory cell rows and selectively activated in a reading operation under the control of said cell select circuit;
   a plurality of write word lines provided corresponding respectively to said memory cell rows and selectively activated in a writing operation under the control of said cell select circuit;
   a plurality of read bit line pairs provided corresponding respectively to said memory cell columns to transmit storage data from a selected memory cell in said reading operation;
   a plurality of write bit line pairs provided corresponding respectively to said memory cell columns to transmit storage data to a selected memory cell in said writing operation; and
   a bit line pair potential control circuit capable of precharging each of said read bit line pairs and supplying a prescribed current to each of said read bit line pairs at least in said reading operation,
   each said memory cell including:
      a latch circuit having first and second input/output nodes and holding one of first and second potentials;
      first and second read access transistors provided between said first and second input/output nodes and one and the other read bit lines of a corresponding one of said read bit line pairs, respectively to attain a conductive state in response to an activation of a corresponding read word line of said read word lines;
      a first write access transistor and a first storage level driving transistor provided in series between said first input/output node and said first potential, and
      a second write access transistor and a second storage level driving transistor provided in series between said second input/output node and said first potential.

2. The semiconductor memory device according to claim 1, wherein
   said bit line pair potential control circuit includes:
      a precharge circuit to precharge said read bit line pair; and
      a bit line load circuit capable of supplying the prescribed current to said read bit line pairs at least in said reading operation.

3. The semiconductor memory device according to claim 2, wherein said bit line load circuit supplies said prescribed current to said read bit line pairs when said semiconductor memory device is active.

4. The semiconductor memory device according to claim 3, wherein said prescribed current supplied to said read bit line pair by said bit line load circuit is set so that the potential level of said read bit line pair in a reading operation is higher than the threshold level of said latch circuit.

5. The semiconductor memory device according to claim 2, wherein said cell select circuit includes a convolution access detecting circuit to detect simultaneous designation of a writing operation and a reading operation to respective ones of a plurality of memory cells belonging to the same memory cell row in said memory cell array, and said bit line load circuit supplies said prescribed current to said read bit line pair based on a result of detection by said convolution access detecting circuit.

6. The semiconductor memory device according to claim 5, wherein said prescribed current supplied to said read bit line pair by said bit line load circuit is set so that the potential level of said read bit line pair in a reading operation is higher than the threshold level of said latch circuit.

7. The semiconductor memory device according to claim 1, wherein said cell select circuit includes a convolution access detecting circuit to detect simultaneous designation of a writing operation and a reading operation to respective ones of a plurality of memory cells belonging to the same memory cell row in said memory cell array and generate a precharge control signal, and said bit line pair potential control circuit includes a precharge circuit to precharge said read bit line pair and supplies said prescribed current to said bit line pair in said reading operation under the control of said precharge control signal.

8. The semiconductor memory device according to claim 7, wherein said prescribed current supplied to said read bit line pair by said recharge circuit is set so that the potential level of said read bit line pair in a reading operation is higher than the threshold level of said latch circuit.

9. The semiconductor memory device according to claim 1, wherein said first read access transistor is a MOS transistor having a gate connected to said read word line, a first source/drain electrode connected to the one read bit line, and a second source/drain electrode connected to the first input/output node, an electrical path being formed between said one read bit line and the first input/output node when said first read access transistor is conductive, said second read access transistor is a MOS transistor having a gate connected to said read word line, a first source/drain electrode connected to the other read bit line, and a second source/drain electrode connected to the second input/output node, an electrical path being formed between said other read bit line and the second input/output node when said second read access transistor is conductive, said first and second write access transistors are MOS transistors having gate electrodes connected to said write word line in common, and said first and second storage level driving transistors are MOS transistors having gate electrodes connected to one and the other of the corresponding write bit line pair, respectively.

* * * * *